United States Patent
Ichikawa

(10) Patent No.: US 9,295,175 B2
(45) Date of Patent: Mar. 22, 2016

(54) SEAL STRUCTURE FOR ELECTRONIC CONTROL DEVICE

(71) Applicant: Hitachi Automotive Systems, Ltd., Hitachinaka-shi, Ibaraki (JP)

(72) Inventor: Eiji Ichikawa, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/630,880

(22) Filed: Feb. 25, 2015

(65) Prior Publication Data
US 2015/0250072 A1 Sep. 3, 2015

(51) Int. Cl.
*H01R 13/52* (2006.01)
*H05K 5/06* (2006.01)
*H01R 24/76* (2011.01)
*H01R 13/66* (2006.01)

(52) U.S. Cl.
CPC ............ *H05K 5/063* (2013.01); *H01R 13/5213* (2013.01); *H01R 13/6658* (2013.01); *H01R 24/76* (2013.01)

(58) Field of Classification Search
CPC ......................... H01R 13/5221; H01R 13/5208
USPC .................. 439/274, 275, 587, 588, 589, 148
See application file for complete search history.

(56) References Cited

U.S. PATENT DOCUMENTS

| | | | | |
|---|---|---|---|---|
| 6,203,348 B1* | 3/2001 | Fukuda | ............. | H01R 13/5208 439/271 |
| 6,244,886 B1* | 6/2001 | Strang | ................ | H01R 13/5202 439/271 |
| 6,254,431 B1* | 7/2001 | Murakami | ......... | H01R 13/5221 439/587 |
| 6,257,928 B1* | 7/2001 | Murakami | ........... | H01R 13/506 439/587 |
| 6,309,252 B1* | 10/2001 | Murakami | ........... | H01R 13/506 439/274 |
| 6,325,669 B1* | 12/2001 | Safai | .................. | H01R 13/5208 439/274 |
| 2014/0065877 A1* | 3/2014 | Ohhashi | ............... | H05K 5/0052 439/519 |
| 2015/0250072 A1* | 9/2015 | Ichikawa | ............... | H05K 5/063 439/587 |

FOREIGN PATENT DOCUMENTS

JP 2014-49702 A 3/2014

* cited by examiner

*Primary Examiner* — Phuongchi T Nguyen
(74) *Attorney, Agent, or Firm* — Crowell & Moring LLP

(57) ABSTRACT

Disclosed is a seal structure for an electronic control device where a circuit board is accommodated in a housing with a connector attached to the circuit board and held between base and cover members of the housing. The seal structure includes a connector seal surface formed on a front end portion of the base member, a seal material arranged between the connector seal surface and the connector, a seal groove formed in an outer peripheral portion other than the front end portion of the base member, a seal protrusion formed on the cover member and engaged in the seal groove, and a sealant filled between the seal groove and the seal protrusion. Longitudinal end regions of the connector seal surface are extended in a width direction of the connector. Longitudinal end regions of the seal groove are connected perpendicular to the respective end regions of the connector seal surface.

7 Claims, 6 Drawing Sheets

SEAL STRUCTURE FOR ELECTRONIC CONTROL DEVICE

BACKGROUND OF THE INVENTION

The present invention relates to a seal structure suitable for an electronic control device such as engine control unit or automatic transmission control unit. Hereinafter, the terms "upper" and "lower" are used with respect to the height (thickness) direction of the electronic control device; and the terms "front" and "rear" are used with respect to the insertion direction of a connector of the electronic control device for connection to an external device. It should however be noted that these terms are used for illustration purposes and are not intended to limit the scope of the present invention.

Japanese Laid-Open Patent Publication No. 2014-049702 discloses a seal structure for an electronic control device such as engine control unit or automatic transmission control unit. The electronic control device includes a housing having a base member and a cover member fitted on an upper side of the base member, a circuit board accommodated in an inner space of the housing and a connector attached to a front end side of the circuit board and exposed through a front opening window between the base and cover members of the housing.

A first connector seal surface is formed on an upper surface of a front end portion of the base member in a width direction of the connector. A substantially U-like shaped continuous seal groove is formed in an upper surface of an outer peripheral end portion other than the front end portion of the base member. Both end regions of the seal groove are bent inwardly in a substantially L-like shape and extend continuously to longitudinal end regions of the first connector seal surface.

On the other hand, a front end portion of the cover member is expanded in a thickness direction of the connector such that the opening window is defined between the front end portion of the base member and the expanded front end portion of the cover member. A substantially U-like shaped continuous seal protrusion is formed on a lower surface of an outer peripheral end portion other than the expanded front end portion of the cover member.

The seal protrusion is engaged in the seal groove, with a sealant filled in a clearance between the seal protrusion and the seal groove, so as to provide a so-called protrusion-groove seal between the base member and the cover member. In this protrusion-groove seal, the sealant can ensure its seal length by engagement between the seal protrusion and the seal groove.

The connector is held between the front end portion of the base member and the expanded front end portion of the cover member, with a first connector seal material (elongated seal tape) arranged between the first connector seal surface of the base member and a lower surface of the connector and a second connector seal material (elongated seal tape) arranged between a lower and inner lateral surface of the expanded front end portion of the cover member and an upper and outer lateral surfaces of the connector, so as to provide a so-called plane seal between the connector and the housing.

Further, fixing holes are formed in four peripheral corners of the base member; and fixing protrusions are formed on four peripheral corners of the cover member. By engagement of the fixing protrusions in the fixing holes, the cover member is fixed in position on the base member. The cover member is then secured to the base member by screws.

SUMMARY OF THE INVENTION

In the above-disclosed electronic control device, the positioning of the cover member relative to the base member is done with predetermined dimensional tolerances by engagement of the fixing protrusions in the fixing holes. If there occur even slight variations in the dimensional tolerances, the lower surface of the connector may be displaced in position in the width direction relative to the first connector seal surface of the base member and thereby slightly laid over either one of junctions between the end regions of the first connector seal surface and the end regions of the seal groove. At such a junction between the connector seal surface and the seal groove, the sealant spreads over and covers the lower surface of the connector, without being pushed into the seal groove by the seal protrusion, so that it becomes impossible to ensure the sufficient seal length of the sealant in the protrusion-groove seal. This results in the entry of water etc. from the outside due to deterioration in seal performance.

The present invention has been made in view of the foregoing technical problem. It is an object of the present invention to provide a seal structure for an electronic control device, capable of preventing deterioration in seal performance while allowing downsizing of the electronic control device.

According to one aspect of the present invention, there is provided a seal structure for an electronic control device, the electronic control device comprising: a housing having a base member and a cover member fitted on an upper side of the base member; a circuit board accommodated in an inner space of the housing; and a connector attached to a front end of the circuit board and exposed through a front opening window between front end portions of the base and cover members of the housing, the seal structure comprising: a connector seal surface formed on an upper surface of the front end portion of the base member; a connector seal material arranged between the connector seal surface of the base member and a lower surface of the front end portion of the connector; a seal groove formed in an upper surface of an outer peripheral portion other than the front end portion of the base member; a seal protrusion formed on a lower surface of an outer peripheral portion of the cover member and engaged in the seal groove; and a sealant filled in a clearance between the seal groove and the seal protrusion, wherein longitudinal end regions of the connector seal surface are extended in a width direction of the connector and formed as extended surface regions; and wherein longitudinal end regions of the seal groove extend perpendicular to the respective extended surface regions of the connector seal surface.

It is possible according to the present invention to, even when the connector is displaced in position relative to the base member, prevent deterioration in seal performance at the junction between the connector seal surface and the seal groove.

The other objects and features of the present invention will also become understood from the following description.

DESCRIPTIONS OF THE EMBODIMENTS

A seal structure for an electronic control device according to one embodiment of the present invention will be described below with reference to the drawings. The electronic control device is herein configured as an engine control unit of a vehicle. As mentioned above, the terms "front", "rear", "upper" and "lower" are used for illustration purposes and are not intended to limit the scope of the present invention. In the present embodiment, the upper-lower direction of the electronic control device (the thickness direction of the electronic control device) corresponds to the upper-lower direction of FIG. 1. However, this direction does not necessarily correspond to a vertical direction of the vehicle under a state that the electronic control device has been mounted on the vehicle. When the electronic control device is mounted in vertical orientation on the vehicle, for example, the upper-lower direction of the electronic control device is in agreement with the front-rear direction of the vehicle.

First, the basic structure of the electronic control device will be explained below.

Figure 1:
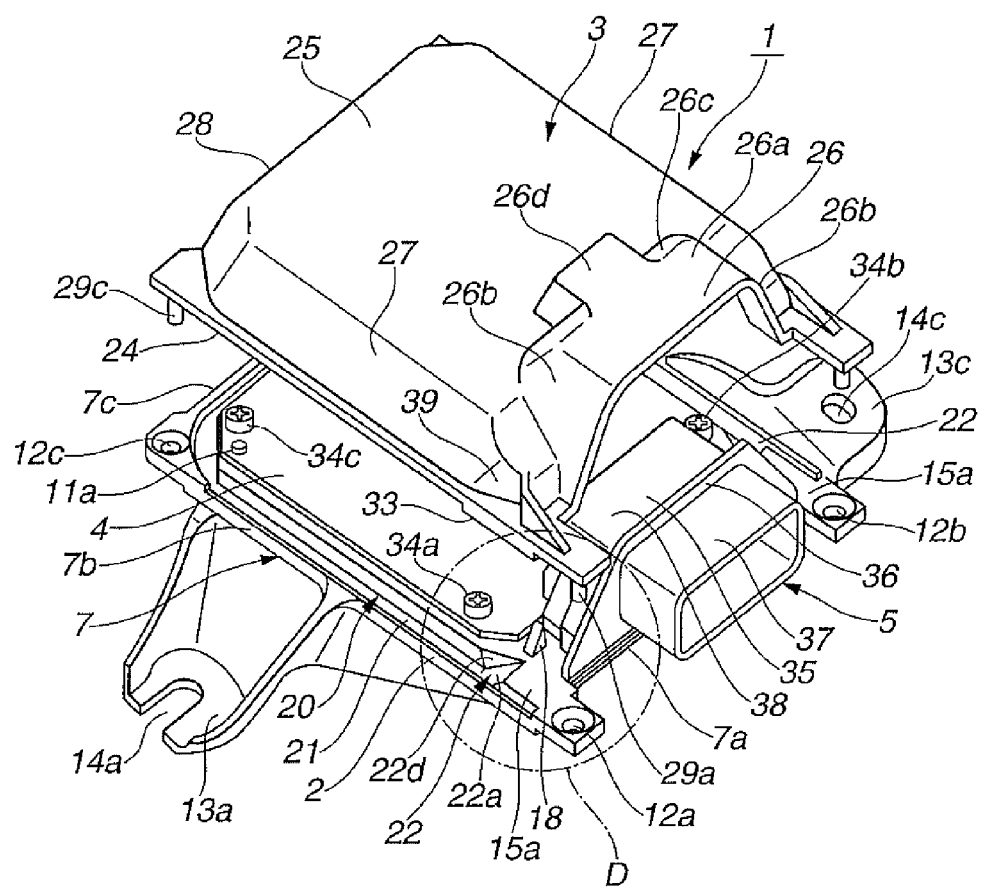
FIG. 1 is an exploded perspective view of an electronic control device with a seal structure according to one embodiment of the present invention.
Figure 4:
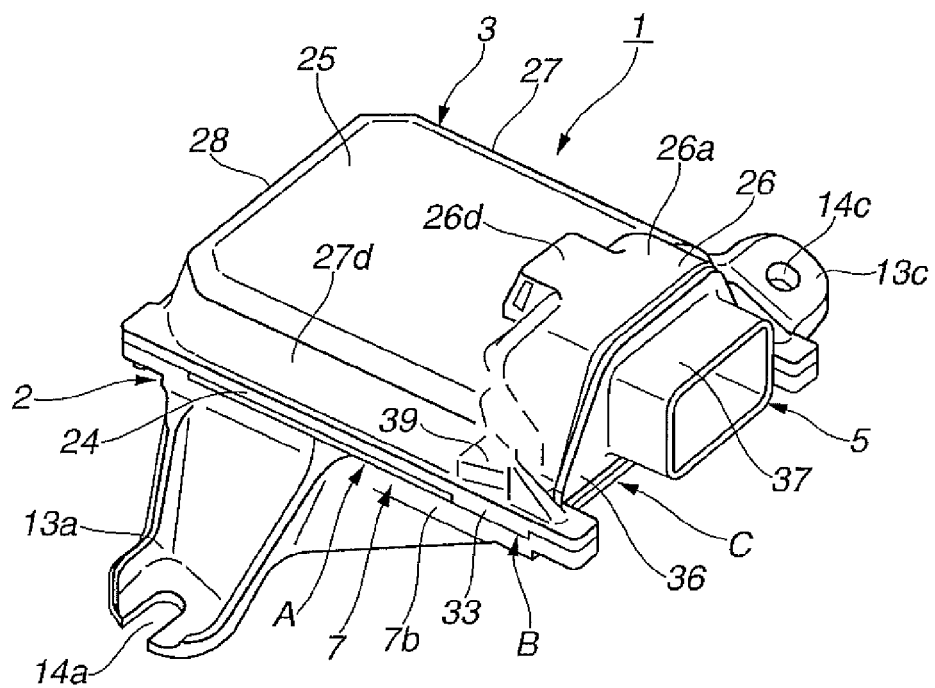
FIG. 4 is an overall perspective view of the electronic control device according to the one embodiment of the present invention.

As shown in FIGS. 1 and 4, the electronic control device includes: a housing 1 having a substantially plate-shaped base member 2 fixed to a vehicle body of the vehicle and a substantially box-shaped cover member 3 fitted on an upper side of the base member 2; a circuit board 4 accommodated in an inner space of the housing 1; and a connector 5 having a connector body 35 held in a front opening window between the base and cover members 2 and 3 of the housing 1 and attached to a front end side of the circuit board 4. Although not specifically shown in the drawings, the circuit board 4 has a wiring circuit pattern formed on a thin insulating substrate and mounting thereon various electronic components. Further, the connector 5 has a front end portion 37 (as a connection port) formed integral with the connector body 35 via a flange 36 and accommodating therein a plurality of female connectors for connection to a given device (such as sensor or pump) through a vehicle-side connector.

The base member 2 is integrally formed of a highly heat conductive metal material such as aluminum and has a shallow box shape with its outer peripheral edge rising slightly.

Figure 2:
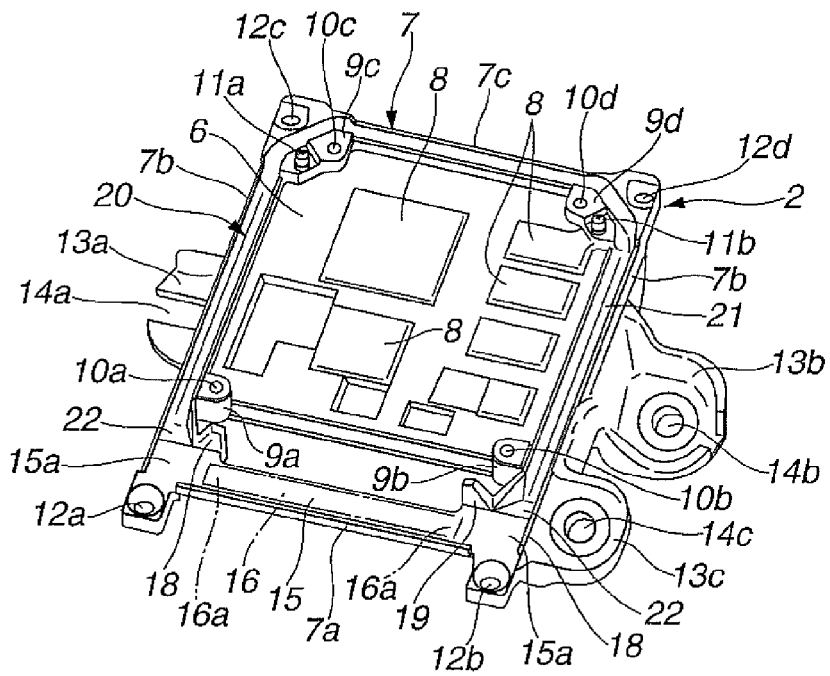
FIG. 2 is a perspective view of a housing base member of the electronic control device, as viewed from the diagonally upper side, according to the one embodiment of the present invention.

More specifically, the base member 2 includes a substantially rectangular bottom wall 6 and a frame-shaped peripheral wall 7 extending upward from an outer peripheral edge of the bottom wall 6 as shown in FIGS. 1 and 2. The peripheral wall 7 consists of a front wall 7a, lateral walls 7b and a rear wall 7c. A plurality of different-sized rectangular stages 8 are integrally formed on an upper surface of the bottom wall 6.

Three brackets 13a, 13b and 13c with bolt insertion holes 14a, 14b and 14c are formed integral with the bottom wall 6 of the base member 2 for fixing of the base member 2 to the vehicle body by tightening of bolts into the bolt insertion holes 14a, 14b and 14c.

Boss portions 9a, 9b, 9c and 9d (two front boss portions 9a and 9b and two rear boss portions 9c and 9d) are integrally provided on four respective corners of the bottom wall 6 inside the peripheral wall 7 so as to support thereon the circuit board 4. Female thread holes 10a, 10b, 10c and 10d are formed in the boss portions 9a, 9b, 9c and 9d, respectively, for fixing of the circuit board 4 by tightening of screws 34a, 34b, 34c and 34d into the female thread holes 10a, 10b, 10c and 10d. Positioning pins 11a and 11b are formed on the rear boss portions 9c and 9d and inserted into positioning holes of the circuit board 4, respectively, for positioning of the circuit board 4 on the boss portions 9a, 9b, 9c and 9d.

Boss portions are also integrally provided on four respective corners of the bottom wall 6 outside the peripheral wall 7. Fixing holes 12a, 12b, 12c and 12d are formed through these outer boss portions for positioning of the cover member 3 relative to the base member 2 by engagement of fixing protrusions 29a, 29b, 29c and 29d of the cover member 3 in the fixing holes 12a, 12b, 12c and 12d. Among these four fixing holes, three fixing holes 12b, 12c and 12d are made slightly larger in diameter than the fixing protrusions 29b, 29c and 29d for improvement of positioning accuracy. The remaining one fixing hole 12a is formed into an oval shape so as to allow slight radial movement of the fixing protrusion 29a for ease of assembling.

Figure 5:
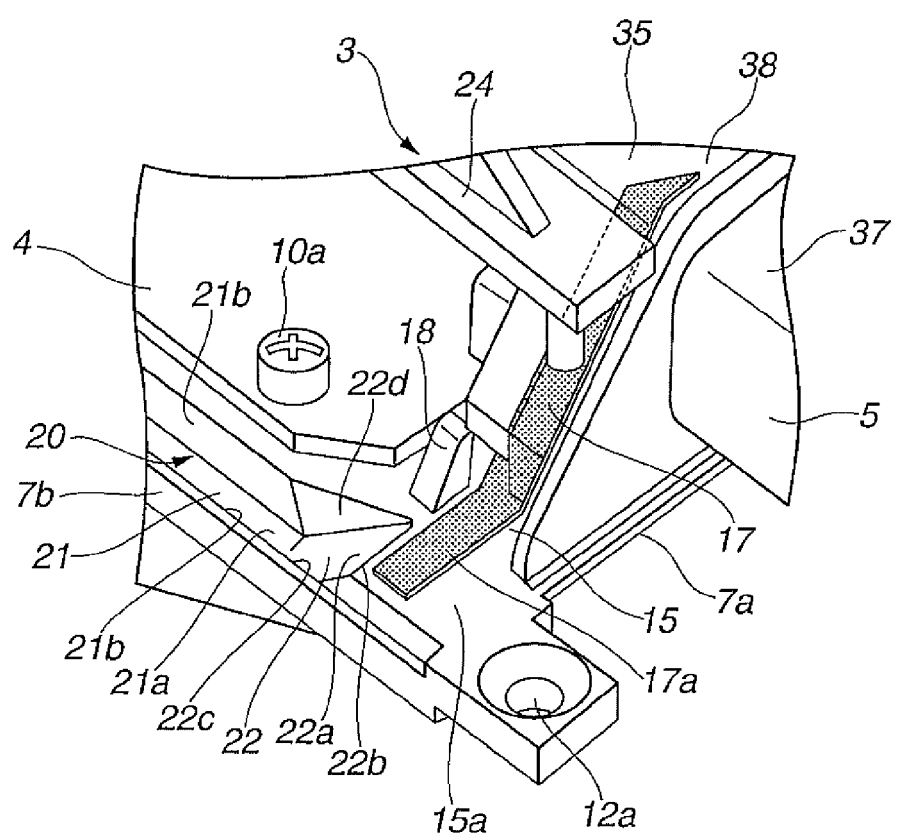
FIG. 5 is an enlarged perspective view of part D of FIG. 1, showing one of junctions between a connector seal surface and a seal groove of the housing base member according to the one embodiment of the present invention.

As clearly shown in FIGS. 2 and 5, a first connector seal surface 15 is formed in an elongated flat shape along an upper surface of the front wall 7a of the base member 2. Longitudinal end regions of the first connector seal surface 15 are straightly extended to vicinities of outer peripheral edges of the lateral walls 7b and adapted as extended surface regions 15a. A first connector seal material 16 (elongated seal tape) is adjusted in length and applied to any region other than the extended surface regions 15a of the first connector seal surface 15 so as to extend up to vicinities of the extended surface regions 15a. A lower surface of the connector 5 (connector body 35) is adhered to the upper surface of the front wall 7a of the base member 2 via the first connector seal material 16.

Figure 6:
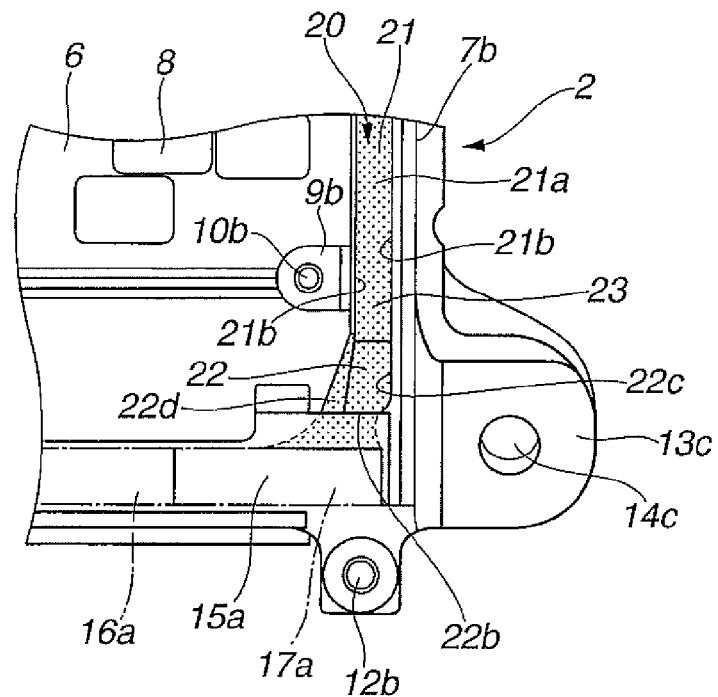
FIG. 6 is an enlarged plan view of part of the electronic control device, showing the other junction between the connector seal surface and the seal groove of the housing base member according to the one embodiment of the present invention.

On the other hand, a second connector seal surface 38 is formed in a flattened U-like shape along an upper and outer lateral surfaces of the connector 5 (connector body 35) as clearly shown in FIG. 1. A second connector seal material 17 (elongated seal tape) is adjusted in length and applied to the whole of the second connector seal surface 38 and to the extended surface regions 15a of the first connector seal surface 15. Longitudinal end regions 17a of the second connector seal material 17, which have been applied to the extended surface regions 15a of the first connector seal surface 15, are continuously connected from the plane direction to longitudinal end regions 16a of the first connector seal material 16 as shown in FIG. 6. A lower and inner lateral surfaces of the after-mentioned front end portion 26 of the cover member 3 is adhered to the upper and outer lateral surfaces of the connector 5 (connector body 35) and to the longitudinal end regions (extended surface regions) 15a of the front wall 7a of the base member 2 are adhered to via the second connector seal material 17.

By these connector seal materials 16 and 17, there are provided plane seals between the upper surface of the front wall 7a of the base member 2 and the lower surface of the connector 5 (see FIG. 8C) and between the lower and inner lateral surfaces of the front end portion 26 of the cover member 3 and the upper and outer lateral surfaces of the connector 5.

Furthermore, a pair of substantially triangular protrusions 18 and 19 are integrally formed on inner peripheral end parts of the front wall 7a and brought into contact with lateral sides of the connector body 35 for positioning of the connector 5 in the width direction relative to the base member 2 during attachment of the connector 5.

A continuous seal groove 20 is formed in upper surfaces of the lateral and rear walls 7b of the base member 2 so as to extend in a substantially U-like shape when viewed in plan as shown in FIGS. 1, 2, 5 and 6. This seal groove 20 includes a groove region 21 formed almost throughout its length and longitudinal end regions 22 (as linking regions) formed adjacent to ends of the groove region 21.

Figure 8A:
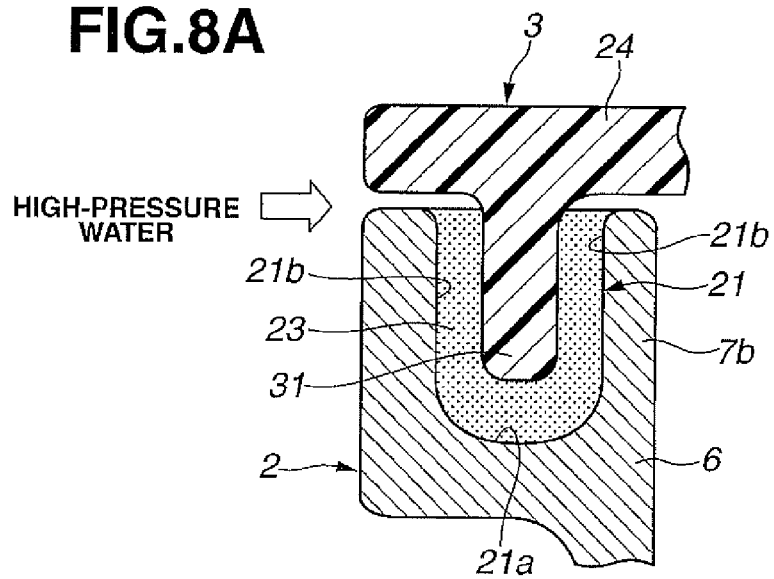
FIG. 8A is a cross-sectional view of the seal structure, as taken at point A of FIG. 4, according to the one embodiment of the present invention.

The groove region 21 has a substantially U-like shape with a deepest bottom surface 21a and lateral wall surfaces 21b when viewed in cross section (also see FIG. 8A).

The end regions 22 extend straightly toward the front wall 7a and perpendicular to the extended surface regions 15a of the first connector seal surface 15. Each of the end regions 22 also has a substantially U-like shape with a bottom surface 22a and lateral wall surfaces 22c and 22d when viewed in cross section (see also FIG. 8B). The bottom surfaces 22a of the end regions 22 are inclined in a flat tapered shape so as to gradually rise from front ends of the deepest bottom surface 21a of the groove region 21 to the extended surface region 15a of the first connector seal surface 15. These bottom surfaces 22a are smoothly and continuously connected at front ends 22b thereof to the respective extended surface regions 15a. The outer lateral wall surfaces 22c of the end regions 22 are aligned with the outer lateral wall 21b of the groove region 21 and extended straightly to the extended surface regions 15a, whereas the inner lateral wall surfaces 22d of the end regions 22 are tapered and inclined relative to the inner lateral wall 21b of the groove region 21 such that the groove width (diameter) of the end regions 22 gradually increases toward the front. Namely, the end regions 22 are substantially triangular in plan, with their apexes directed to the deepest bottom surface 21a of the groove region 21, and are gradually widened toward the extended surface regions 15a.

In the present embodiment, the junctions between the bottom surface 21a of the groove region 21 and the bottom surfaces 22a of the end regions 22 and between the bottom surfaces 22a and the lateral wall surfaces 22c and 22d of the end regions 22 are curved into a continuous circular arc shape.

The cover member 3 is integrally formed of a synthetic resin material lower in weight and cost than the metal material and has a substantially box shape. The fixing protrusions 29a, 29b, 29c and 29d are formed on four respective corners of the cover member 3 and engaged in the fixing protrusions 29a, 29b, 29c and 29d in the fixing holes 12a, 12b, 12c and 12d of the base member 2 for positioning of the cover member 3 relative the base member 2 as mentioned above.

Figure 3:
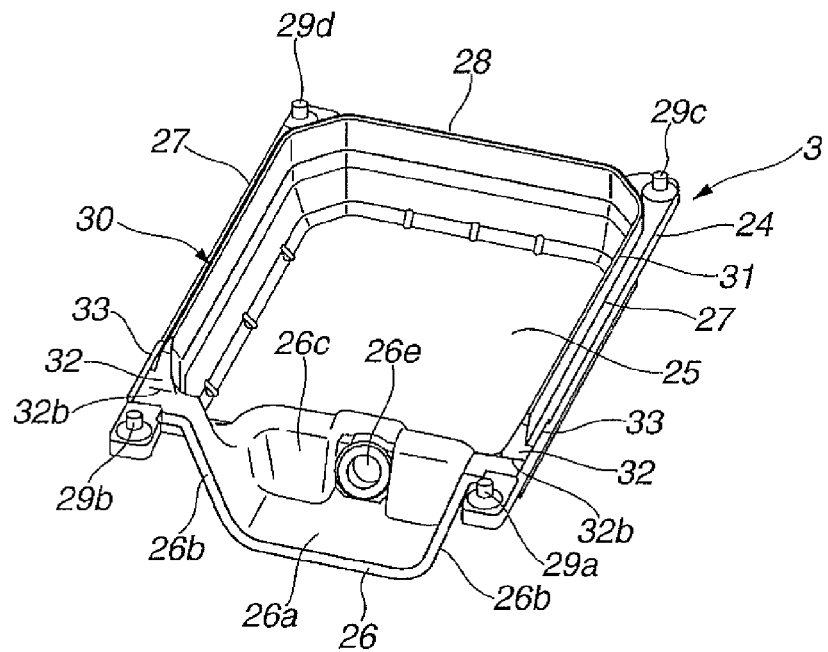
FIG. 3 is a perspective view of a housing cover member of the electronic control device, as viewed from the diagonally lower side, according to the one embodiment of the present invention.

More specifically, the cover member 3 includes a substantially U-like plate-shaped peripheral wall 24, a top wall portion 25 covering the upper sides of the circuit board 4 and the connector 5, a front end portion 26 (as a window wall portion) formed on a front end side of the top wall portion 25 and lateral and rear walls 27 and 28 extending from the peripheral wall 24 and surrounding lateral and rear end sides of the top wall portion 25 as shown in FIGS. 1, 3 and 4.

The front end portion 26 is formed in a trapezoidal expanded shape to define the opening window through which the front end portion 37 of the connector 5 is exposed to the outside. The front end portion 26 has a top wall 26a covering the upper side of the connector 5, lateral walls 26b formed on lateral sides of the top wall 26a and inclined along the lateral surfaces of the connector body 35 and a rear wall 26c inclined from a rear edge of the top wall 26a to a front edge of the top wall portion 25.

As shown in FIG. 3, a vent hole 26e is formed through the rear wall 26c in the thickness direction. An air-permeable waterproof membrane, which is made of an air-permeable waterproof material such as Gore-Tex (trademark) in a thin-film shape, is disposed in the vent hole 26e although not shown in the drawings. A protection wall 26d is arranged on the rear wall 26c so as to cover the vent hole 26e and protect the air-permeable waterproof membrane from direct collision with high-temperature high-pressure water during vehicle washing etc.

Figure 7:
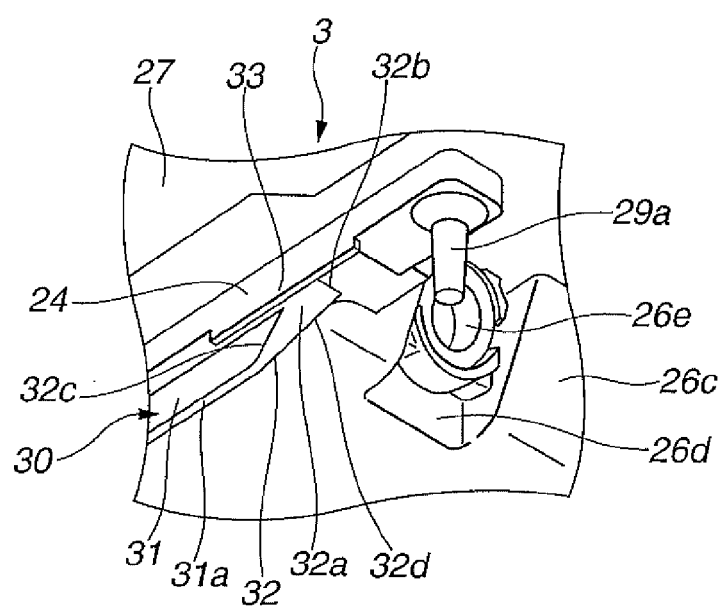
FIG. 7 is an enlarged view of part of the electronic control device, showing a seal protrusion of the housing cover member according to the one embodiment of the present invention.

As shown in FIGS. 3 and 7, a continuous seal protrusion 30 is formed throughout a lower surface of the U-like shaped peripheral wall 24 of the cover member 3 so as to correspond in shape and position to the seal groove 20. This seal protrusion 30 includes a protrusion region 31 formed almost throughout its length and longitudinal end regions 32 formed adjacent to ends of the protrusion region 31. The protrusion 31 and the end regions 32 are similar in cross section to the groove region 21 and the end regions 22 of the seal groove 20, respectively.

The protrusion region 31 has a substantially U-like shape with a bottom surface 31a and lateral wall surfaces when viewed in cross section (also see FIG. 8A).

The height and width of the protrusion region 31 of the seal protrusion 30 (i.e. the dimension from the bottom surface 31a of the protrusion region 31 to the lower surface of the peripheral wall 24 and the dimension between the lateral wall surfaces of the protrusion region 31) are made smaller than the depth and width of the groove region 21 of the seal groove 20 (i.e. the dimension from the deepest bottom surface 21a of the groove region 21 to the upper surfaces of the lateral walls 7b and the rear wall 7c and the dimension between the lateral wall surfaces 21b of the groove region 21), respectively. The protrusion region 31 of the seal groove 30 is thus engaged in the groove region 21 of the seal groove, with a U-like shaped clearance left between the protrusion region 31 and the groove region 21.

Figure 8B:
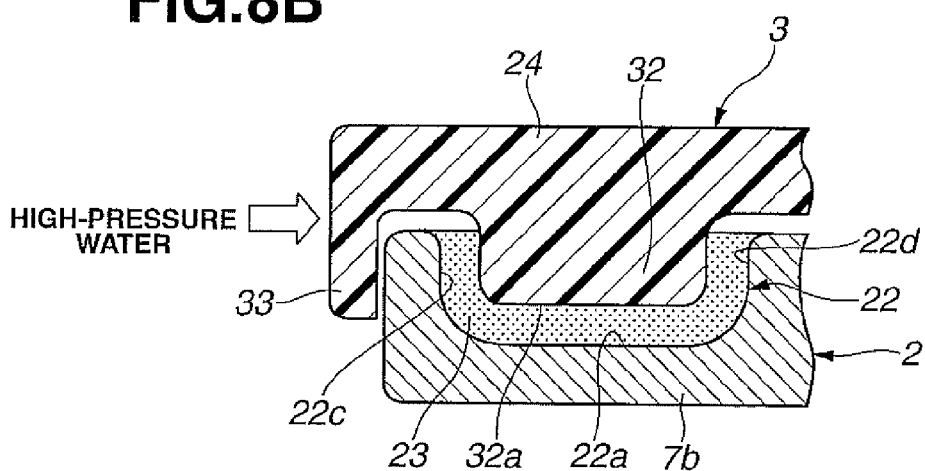
FIG. 8B is a cross-sectional view of the seal structure, as taken at point B of FIG. 4, according to the one embodiment of the present invention.

Each of the end regions 32 also has a substantially U-like shape with a bottom surface 32a and lateral wall surfaces 32c and 32d when viewed in cross section (see also FIG. 8B). The bottom surfaces 32a of the end regions 32 are inclined in a flat tapered shape so as to gradually rise from the bottom surface 31a of the protrusion region 31 to the peripheral wall 24. These bottom surfaces 32a are smoothly and continuously connected at front edges 32b thereof to the lower surface of the peripheral wall 24. The outer lateral wall surfaces 32c of the end regions 32 are aligned with the outer lateral wall surface of the protrusion region 31 and extended straightly toward the front, whereas the inner lateral wall surfaces 32d of the end regions 32 are tapered and inclined relative to the inner lateral wall surface of the protrusion region 31 such that the protrusion width (diameter) of the end regions 32 gradually increases toward the front. Namely, the end regions 32 are substantially triangular in plan, with their apexes directed to the bottom surface 31a of the protrusion region 31a, and are gradually widened toward the front.

The end regions 32 of the seal protrusion 30 are engaged in the end regions 22 of the seal groove 20 with clearances left therebetween as the height and width of the end regions 32 of the seal protrusion 30 are made smaller than the height and width of the end regions 22 of the seal groove 20.

In the present embodiment, the junctions between the bottom surface 31a of the protrusion region 31 and the bottom surfaces 32a of the end regions 32 and between the bottom surfaces 32a and the lateral wall surfaces 32c and 32d of the end regions 32 are also formed into a continuous circular arc shape in accordance with the shape of the seal groove 20.

A sealant 23 is filled in the clearance between the seal protrusion 30 and the seal groove 20 (i.e. between the protrusion region 31 and the groove region 21 and between the end regions 32 and the end regions 22). As the sealant 23, there can be used an adhesive of the type that cures with time or of the half-kneaded thermosetting type. By this sealant 23, there is provided a protrusion-groove seal between the upper surface of the base member 2 and the lower surface of the cover member 3 (see FIGS. 8A and 8B). Herein, the width and depth of the seal groove 20 (groove region 21) and the width and protrusion height of the seal protrusion 30 (seal region 31) are adjusted as appropriate so as to ensure the seal length of the sealant 23 and exert the sufficient seal performance of the protrusion-groove seal.

When the sealant 23 overflows from the end regions 22 of the seal groove 20 by engagement of the end regions 32 of the seal protrusion 30 in the end regions 22 of the seal groove 20, the overflowing sealant 23 is brought into contact with and connected to the end portions 17a of the second connector seal material 17. As a result, the sealant 23 is combined and integrated with the second connector seal material 17.

As shown in FIGS. 1, 3, 4 and 7, a pair of guard walls 33 are integrally formed on front outer peripheral edge parts of the base member 3 at positions corresponding to the end regions 22 of the seal groove 20 and the extended surface regions 15a of the first connector seal surface 11. Each of the guard wall 33 has an elongated plate shape extending along the lateral wall 7b. The length of the guard walls 33 is set such that, when the cover member 3 is fitted on the base member 2, the end regions 22 of the seal groove 22 and the extended surface regions 15a of the first connector seal surface 11 are covered from the outside by the guard walls 33.

Furthermore, thinned portions 39 are formed on the cover member 3 at positions between the peripheral wall 24 and the lateral walls 26b, that is, at positions above the end regions 32 of the seal protrusion 30 in the end regions 22 of the seal groove 20 as shown in FIGS. 1 and 4. If these portions are increased in thickness, there is a possibility of warpage occurring due to shrinkage etc. during the resin molding of the seal protrusion 30 (protrusion region 31). The thinned portions 39 are effective to prevent such warpage due to shrinkage etc.

Next, the operation and effects of the electronic control device will be explained below.

The housing 1 (base and cover members 2 and 3), the circuit board 4 and the connector 5 are assembled into the electronic control device by the following process. First, the connector 5 is attached to the circuit board 4 by e.g. screws. The first connector seal material 16 is applied to the first connector seal surface 15 of the base member 2. The circuit board 4 to which the connector 5 has been attached is fixed in position on the base member 2 by insertion of the positioning pins 11a and 11b of the base member 2 into the positioning holes of the circuit board 4, and then, secured to the base member 2 by tightening of the screws 34a, 34b, 34c and 34d into the female thread holes 10a, 10b, 10c and 10d of the base member 2. The second connector seal material 17 is applied to the second connector seal surface 38 of the connector 5 and to the extended surface regions 15a of the first connector seal surface 15 of the base member 2. The sealant 23 is filled in the whole of the seal groove 20 (including the end regions 22) of the base member 2. The cover member 3 is fixed in position and secured so as to cover the circuit board 4 and the connector 5 on the base member 2 by engaging the fixing protrusions 29a, 29b, 29c and 29d of the cover member 3 into the fixing holes 12a, 12b, 12c and 12d of the base member 2 while engaging the seal protrusion 30 (protrusion region 31 and end regions 32) of the cover member 3 into the seal groove 20 (groove region 21 and end regions 22) of the base member 2.

As compared to the conventional art where the end regions of the seal groove are bent inwardly into a substantially L-like shape, the end regions 22 of the seal groove 20 are adjusted in length such that the extended surface regions 15a of the first connector seal surface 15 are extended to the vicinities of the outer peripheral edges of the lateral walls 7b and located in front of front edges of the end regions 22 of the seal groove 20 as mentioned above in the present embodiment.

Even when the connector 5 is displaced in position in the width direction due to variations in dimensional tolerances during the assembling process, the lower surface of the connector 5 is laid over a part of either one of the extended surface regions 15a of the first connector seal surface 15 but is not laid over the end regions 22 of the seal groove 20. In other words, the lower surface of the connector 5 is situated above either one of the extended surface regions 15a of the first connector seal surface 15 and does not exert any influence on the end regions 22 of the seal groove 20 so that the sealant 23 is properly pushed into the end regions 22 of the seal groove 20 by the end regions 32 of the seal protrusion 30 even when the connector 5 is displaced in position in the width direction during the assembling process. Thus, the sealant 23 can ensure not only the sufficient seal length between the groove region 21 of the seal groove 20 and the protrusion region 31 of the seal protrusion 30 as shown in FIG. 8A, but also the sufficient seal length between the end regions 22 of the seal groove 20 and the end regions 32 of the seal protrusion 30 as shown in FIG. 8B. It is therefore possible to prevent deterioration in the seal performance of the protrusion-groove seal between the end regions 22 of the seal groove 20 and the end regions 32 of the seal protrusion 30.

Figure 8C:
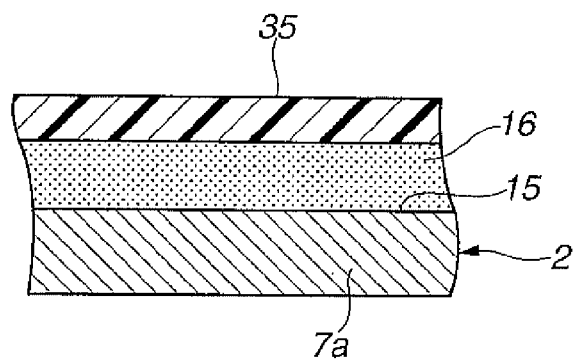
FIG. 8C is a cross-sectional view of the seal structure, as taken at point C of FIG. 4, according to the one embodiment of the present invention.

The first and second connector seal materials 16 and 17 can also ensure the sufficient seal length between the housing 1 and the connector 5 as shown in FIG. 8C as these seal materials 16 and 17 are properly applied to the connector seal surfaces 15 and 38.

In the present embodiment, the junctions between the end regions 22 of the seal groove 20 and the extended surface regions 15a of the first connector seal surface 15 are covered from the outside by the guard walls 33. Even when high-pressure water is fed from the outside, the entry of such high-pressure water can be effectively prevented by the guard walls 33. It is thus possible to improve the durability of the sealant 23 and the connector seal materials 16 and 17 while achieving the high seal performance of the seals between the base member 2 and the cover member 3 and between the housing 1 and the connector 5.

Further, the inner lateral wall surfaces 22d of the end regions 22 of the seal groove 20 are inclined in a tapered shape such that the end regions 22 are gradually widened toward the extended surface regions 15a of the first connector seal surface 15 in the present embodiment. In these end regions 22 of the seal groove 20, the sealant 23 is pushed and spread toward the inner lateral wall surfaces 22d by the end regions 32 of the seal protrusion 30. It is thus increase the seal length of the sealant 23 between the end regions 22 of the seal groove 20 and between the end regions 32 of the seal protrusion 30 for improvement in seal performance.

By engagement of the end regions 32 of the seal protrusion 30 in the end regions 22 of the seal groove 20, the sealant 23 partially overflows from the end portions 22 of the seal groove 20, spreads over the extended surface regions 15a of the first connector seal surface 15 and comes into contact/connection with lateral edges of the end regions 17a of the second connector seal material 17 as shown in FIG. 6. This continuous connection of the sealant 23 and the connector seal material 17 contributes to improvement in seal performance. Moreover, the end regions 16a of the first connector seal material 16 are connected to connector-side edges of the end regions 17a of the second connector seal material 17 as shown in FIG. 6. This continuous connection of the connector seal materials 16 and 17 also contributes to improvement in seal performance.

In the present embodiment, the electronic control device has a connector exposed structure where the connector body 35 is held between the front end portions of the base and cover members 2 and 3 from the upper and lower sides such that the front end portion (connector portion) 37 of the connector 5 is exposed from the front side of the housing 1. In such a type of electronic control device, the connector seal materials 16 and 17 are applied to the entire peripheral circumference (upper, lower and lateral joint surfaces) of the connector body 35. The plane seals are provided between the connector 5 and the housing 1 (base and cover members 2 and 3) by these connector seal materials 16 and 17 for sealing of the inside of the housing 1. On the other hand, the protrusion-groove seal is provided between the seal groove 20 and the seal protrusion 30 by the sealant 23. In the case of using the protrusion-groove seal in combination with the plane seals, however, there may be discontinuity between the protrusion-groove seal and the plane seals. The occurrence of such seal discontinuity becomes a cause of deterioration in seal performance. Further, steps or edges may be formed as structural inflection points on the joint areas between the plane seal and the protrusion-groove seal. It is likely that stress will concentrate on these steps or edges.

In view of these problems, the bottom surface 22a and the lateral wall surfaces 22d of the end regions 22 of the seal groove 20 are tapered in shape such that the end regions 22 of the seal groove 20 extend gently and continuously to the extended surface regions 15a in the present embodiment. It is possible by such gentle junction of the seal groove 20 and the connector seal surface 15 to minimize the height dimension of the housing 1 while ensuring the given seal length throughout between the seal groove 20 and the seal protrusion 20. This leads to downsizing of the electronic control device and improvement in mountability of the electronic control device on the vehicle body. In addition, the depth and width of the end regions 22 of the seal groove 20 are gradually changed. The formation of structural inflection points such as steps and edges can be thus avoided for improvement in seal performance and prevention/reduction of stress concentration even though the groove region 21 of the seal groove 20 is different in depth from the end regions 22 of the seal groove 20.

In the present embodiment, the thinned portions 39 are formed on the cover member 3 at the positions above the end regions 32 of the seal protrusion 30 as shown in FIGS. 1 and 4. It is possible by the formation of the thinned portions 39 to prevent warpage due to shrinkage etc. during the resin molding of the seal protrusion 30 (protrusion region 31).

The entire contents of Japanese Patent Application No. 2014-037664 (filed on Feb. 28, 2014) are herein incorporated by reference.

Although the present invention has been described with reference to the above exemplary embodiments, the present invention is not limited to the above exemplary embodiments. Various modification and variation of the embodiments described above will occur to those skilled in the art in light of the above teachings.

The taper angle of the connection regions 22 can be increased or decreased depending on the specifications of the electronic control device.

The cover member 3 can alternatively be formed of an aluminum alloy material or other lightweight material in terms of rigidity.

It is feasible to appropriately set the orientation of the housing 1 relative to the vehicle body. The parts and portions (such as front and rear ends) of the base and cover members 2 and 3 may be named depending on the fixed orientation of the housing 1.

The scope of the present invention is defined with reference to the following claims.

What is claimed is:

1. A seal structure for an electronic control device, the electronic control device comprising: a housing having a base member and a cover member fitted on an upper side of the base member; a circuit board accommodated in an inner space of the housing; and a connector attached to a front end of the circuit board and exposed through a front opening window between front end portions of the base and cover members of the housing, the seal structure comprising:
   a connector seal surface formed on an upper surface of the front end portion of the base member;
   a connector seal material arranged between the connector seal surface of the base member and a lower surface of the front end portion of the connector;
   a seal groove formed in an upper surface of an outer peripheral portion other than the front end portion of the base member;
   a seal protrusion formed on a lower surface of an outer peripheral portion of the cover member and engaged in the seal groove; and
   a sealant filled in a clearance between the seal groove and the seal protrusion,
   wherein longitudinal end regions of the connector seal surface are extended in a width direction of the connector and formed as extended surface regions; and
   wherein longitudinal end regions of the seal groove extend perpendicular to the respective extended surface regions of the connector seal surface.

2. The seal structure for the electronic control device according to claim 1, further comprising: guard walls formed on outer peripheral edge parts of the base member at positions corresponding to the extended surface regions of the connector seal surface.

3. The seal structure for the electronic control device according to claim 1,
   wherein the extended surface regions of the connector seal surface are extended to vicinities of outer peripheral edges of the base member and located in front of the longitudinal end regions of the seal groove.

4. The seal structure for the electronic control device according to claim 1, further comprising: another connector seal material arranged between an upper and outer lateral surfaces of the connector and a lower and inner lateral surfaces of the front end portion of the cover member, wherein longitudinal end regions of the another connector seal material are applied to the respective extended surface regions of the connector seal surface and brought into contact with the sealant.

5. The seal structure for the electronic control device according to claim 1,
wherein thinned portions are formed on the cover member at positions above longitudinal end regions of the seal protrusion.

6. The seal structure for the electronic control device according to claim 1,
wherein the longitudinal end regions of the seal groove have tapered inclined bottom surfaces gradually rising toward the extended surface regions of the connector seal surface.

7. The seal structure for the electronic control device according to claim 6,
wherein each of the longitudinal end regions of the seal groove have at least one of lateral wall surfaces inclined in a tapered shape such that the longitudinal end regions of the seal groove are gradually widened from the bottom surfaces toward the extended surface regions of the connector seal surface.

* * * * *